United States Patent
Choi et al.

(10) Patent No.: US 7,038,293 B2
(45) Date of Patent: May 2, 2006

(54) DISSIPATION OF A CHARGE BUILDUP ON A WAFER PORTION

(75) Inventors: Youngmin A. Choi, Agoura Hills, CA (US); Christine Geosling, Calabasas, CA (US); Henry Abbink, Westlake Village, CA (US)

(73) Assignee: Northrop Grumman Corp., Los Angeles, CA (US)

( * ) Notice: Subject to any disclaimer, the term of this patent is extended or adjusted under 35 U.S.C. 154(b) by 0 days.

(21) Appl. No.: 10/811,512

(22) Filed: Mar. 29, 2004

(65) Prior Publication Data

US 2005/0212077 A1    Sep. 29, 2005

(51) Int. Cl.
*H01L 29/00* (2006.01)
(52) U.S. Cl. ...................... 257/510; 257/751
(58) Field of Classification Search ............... 438/637, 438/653, 669, 670; 257/751, 510
See application file for complete search history.

(56) References Cited

U.S. PATENT DOCUMENTS

| 5,129,981 A | 7/1992 | Wang et al. |
| 5,865,938 A * | 2/1999 | Peeters et al. ............. 438/718 |
| 6,333,246 B1 | 12/2001 | Narita et al. |
| 6,812,145 B1 * | 11/2004 | Ma ........................ 438/653 |
| 2002/0104821 A1 | 8/2002 | Bazylenko et al. |

* cited by examiner

*Primary Examiner*—Edward Wojciechowicz
(74) *Attorney, Agent, or Firm*—Patti & Brill, LLC

(57) ABSTRACT

An apparatus in one example comprises a wafer portion that comprises a conduction layer. Upon exposure of the conduction layer during a etch of the wafer portion, the conduction layer serves to dissipate a portion of a charge buildup on the wafer portion during an etch of the wafer portion.

11 Claims, 2 Drawing Sheets

DISSIPATION OF A CHARGE BUILDUP ON A WAFER PORTION

TECHNICAL FIELD

The invention relates generally to etching of silicon wafers and more particularly to the elimination of unwanted etched features due to a charge buildup on exposed structures.

BACKGROUND

To fabricate a mechanical structure, for example Microelectromechanical System ("MEMS") structures, the structure is etched in a wafer. In one example, the wafer comprises a silicon layer and a backing layer, such as photoresist. The etch in one example comprises a Deep Reactive Ion Etch ("DRIE"). The etch comprises a plasma. The plasma in one example contains ions. The ions serve to etch the structure.

During a through-etch of the wafer, the backing layer is exposed. A charge buildup on the structure results from the ions in the etch. The charge buildup serves to deflect the ions to one or more sidewalls of the structure. The deflection of ions results in an undercutting of the sidewalls and/or a creation of one or more protruding features on the structure. In Microelectromechanical System devices, vertical, symmetric sidewalls that lack protruding features are desired.

Turning to FIG. 5 for purposes of illustration, an exemplary wafer portion 505 comprises a silicon layer 515, a backing layer 520, and a mask layer 525. The silicon layer 515 comprises silicon and/or doped silicon. The backing layer 520 comprises a photoresist. The mask layer 525 in one example comprises silicon dioxide.

The wafer portion 505 is through-etched during an etch process that etches a structure 502 within the silicon layer 515. The structure 502 comprises sidewalls 525 and 526. During the through-etch of the structure 502, the backing layer 520 is exposed. Where the backing layer 520 comprises a non-conductive material, (for example, photoresist) a charge buildup results in the structures 530 and 531. The charge buildup deflects ions from the etch process onto the sidewalls 525 and 526 resulting in etching of the sidewalls 525 and 526. The ions produce an undercut 530 in the sidewall 525 and an undercut 531 in the sidewall 526, as will be understood by those skilled in the art.

Thus, a need exists for a reduction of the charge buildup on one or more structures of the wafer.

SUMMARY

The invention in one implementation encompasses an apparatus. The apparatus comprises a wafer portion. The wafer portion comprises a conduction layer. The conduction layer serves to dissipate a portion of a charge buildup on the wafer portion.

Another implementation of the invention encompasses a process. The conduction layer dissipates a portion of a charge buildup on the wafer portion during an etch of the wafer portion.

DESCRIPTION OF THE DRAWINGS

Features of exemplary implementations of the invention will become apparent from the description, the claims, and the accompanying drawings in which:

DETAILED DESCRIPTION

The particular values and configurations discussed in these non-limiting examples can be varied and are cited merely to illustrate an embodiment of the present invention and are not intended to limit the scope of the invention.

Figure 1:
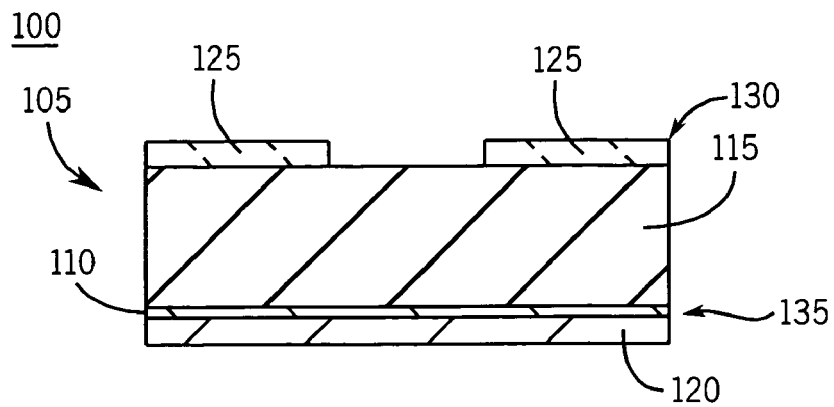
FIG. 1 is a representation of an exemplary implementation of an apparatus that comprises a wafer portion. The wafer portion comprises a conduction layer, a silicon layer, a backing layer, and a mask layer.

Referring to FIG. 1, in an exemplary embodiment, an apparatus 100 comprises a wafer portion 105. The wafer portion 105 comprises a conduction layer 110, a silicon layer 115, a backing layer 120, and a mask layer 125. The conduction layer 110 is electrically coupled with the silicon layer 115. The conduction layer 110 is coupled with the backing layer 120.

The conduction layer 110 comprises a conductive material, such as aluminum or copper. A sputtering process in one example is used to apply the conduction layer 110 to the wafer portion 105. The conduction layer 110 is applied to the wafer portion 105 from about a thickness sufficient to provide for electrical conductivity and to a thickness as is limited by factors such as coating machinery limits and/or wafer structural limits, as will be appreciated by those skilled in the art. For example, the conduction layer 110 is applied to the wafer portion 105 to a thickness in the range of about one half micrometer ("μm") to about two micrometers.

Figure 2:
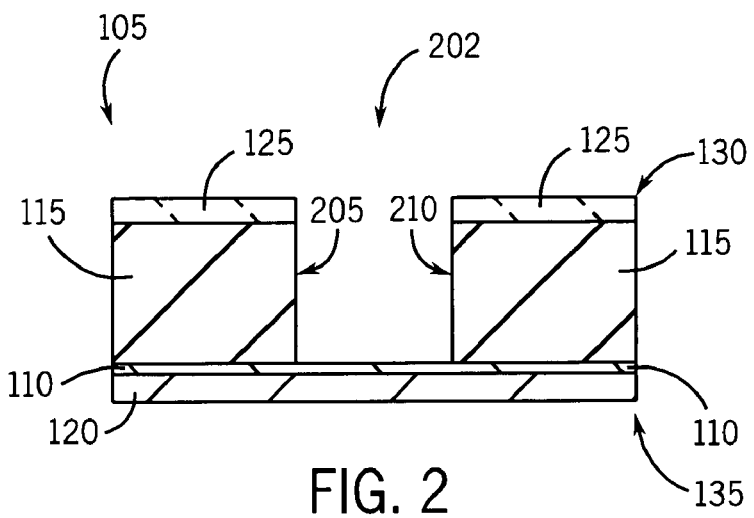
FIG. 2 is a representation of a single-sided etch process performed on the wafer portion of the apparatus of FIG. 1.

Referring to FIGS. 1 and 2, the silicon layer 115 in one example comprises a silicon layer, such as silicon or doped silicon. The wafer portion 105 undergoes an etch process. In one example, the etch process comprises a Deep Reactive Ion Etch ("DRIE"). In another example, the etch process comprises a Bosch process.

The etch process comprises a mixture of reactive species and byproducts of a plasma dissociation process. The mixture of reactive species and byproducts of the plasma dissociation process partially comprises ions. The ions of the etch process serve to etch a structure, for example, a structure 202, in the silicon layer 115, as will be understood by those skilled in the art. The structure 202 in one example comprises one or more sidewalls 205 and/or 210.

The backing layer 120 comprises a thick resist, for example, Shipley STR1045 photoresist, or an organic material. The backing layer 120 is deposited and/or spun onto the wafer portion 105. The backing layer 120 comprises a thickness in the range of about four micrometers to about 10 micrometers. The backing layer 120 provides structural integrity to the wafer portion 105 and to the structure 202 etched in the wafer portion 105. The backing layer 120 also insulates the conduction layer 110 and prevents the conduction layer 110 from becoming part of an undesirable charging path, as will be appreciated by those skilled in the art.

In one example, the backing layer 120 is removed from the wafer portion 105 after completion of the etch process. In another example, the backing layer 120 remains part of the wafer portion 105 after completion of the etch process.

In one example, the mask layer 125 comprises an inorganic material which serves as an etch mask. The mask layer 125 is patterned through a combination of lithographic steps for example: deposition of a resist, pattern exposure/development, oxide etch, and resist removal. In another example, the mask layer 125 comprises a photoresist. A pattern is formed in the photoresist in one example through a deposition of a resist, a pattern exposure, and a development of the pattern. The pattern in the mask layer 125 determines one or more structures, for example, the structure 202, etched in the silicon layer 115, as will be understood by those skilled in the art.

The conduction layer 110, in one example, promotes a reduction in an undercutting of the structure 202 etched in the wafer portion 105. by dissipating a portion of a charge buildup on the wafer portion 105 through exposure of the conduction layer 110 during an etch of the wafer portion 105.

For example, the wafer portion 105 undergoes the etch process, for example, a single-sided etch process. During the etch of the wafer portion 105, the conduction layer 110 is exposed within the structure 202. The conduction layer 110 electrically couples the sidewalls 205 and 210. The sidewalls 205 and 210 comprise respective electrostatic potentials. The respective electrostatic potentials of the sidewalls 205 and 210 comprise electrostatic potentials substantially similar to an electrostatic potential of the conduction layer 110.

During the etch process, a charge buildup occurs on the wafer portion 105. Through exposure of the conduction layer 110, a portion of the charge buildup on the wafer portion 105 is dissipated.

In another example, a portion of the charge buildup on the wafer portion 105 is dissipated through employment of one or more of the sidewalls 205 and 210 of the wafer portion 105 and the conductive layer 110.

By dissipating the portion of the charge buildup on the wafer portion 105 of the structure 202, the conduction layer 110 prevents ions from deflecting onto the sidewalls 205 and 210 of the structure 202, as will be appreciated by those skilled in the art.

In yet another example, the conduction layer 110 mitigates the effects of etch rate variation across the wafer portion 105, as will be appreciated by those skilled in the art. For example, the wafer portion 105 comprises a plurality of structures 202. A first structure 202 comprises a first etch rate and a second structure 202 comprises a second etch rate. The first etch rate differs from the second etch rate, as will be understood by those skilled in the art.

In order to produce a fully-etched structure, the wafer portion 105 undergoes the etch process for a period of time. The period of time comprises a period of time to accommodate each of the etch rates associated with the first structure 202 and the second structure 202. For example, where the first etch rate is greater than the second etch rate, the period of time comprises the period of time to fully-etch the second structure 202.

Upon exposure of the conduction layer 110 within the first structure 202, the conduction layer 110 promotes the reduction of the undercutting. The conduction layer 110 allows the wafer portion 105 to be etched for the period of time to fully-etch the second structure 202 without degrading features of the first structure 202, as will be appreciated by those skilled in the art.

Referring to FIGS. 1–2, an illustrative description of exemplary operation of the apparatus 100 is now presented, for explanatory purposes.

The wafer portion 105 undergoes the etch process on the first side 130 to the point just before the through-etch. The second side 135 of the wafer portion 105 is cleaned. The conduction layer 110, for example, aluminum, is applied to the second side 135 of the wafer portion 105 using a sputtering technique. The backing layer 120, for example, photoresist, is spun or deposited onto the conduction layer 110. The structure 202 of the wafer portion 105 is through-etched during the etch process. The etch process creates the sidewalls 205 and 210 in the wafer portion 105.

The etch process of the structure 202 exposes the conduction layer 110. Upon exposure of the conduction layer 110, the conduction layer 110 dissipates the portion of the charge buildup on the structure 202. The conduction layer 110 and the side walls 205 and 210 are at substantially a similar potential and result in the dissipation of the portion of charge buildup on the structure 202.

Figure 3:
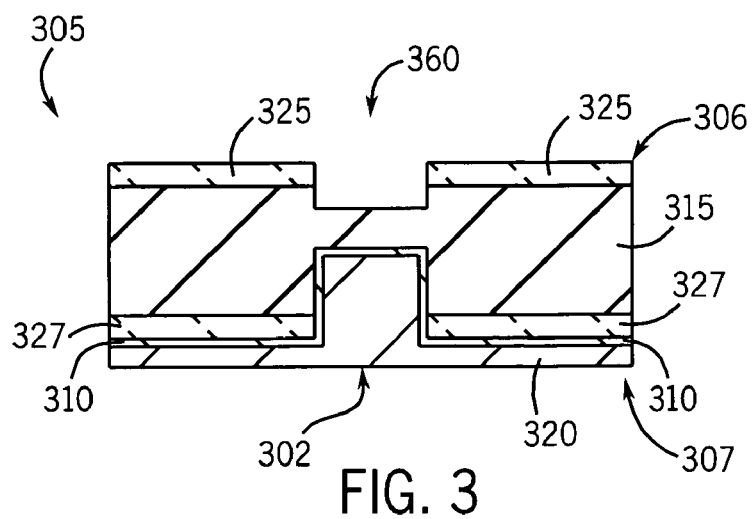
FIG. 3 is a representation of another exemplary implementation of an apparatus that comprises a wafer portion. The wafer portion comprises a conduction layer, a silicon layer, a backing layer, and a mask layer. The wafer portion is processed to a point just prior to a through-etch.
Figure 4:
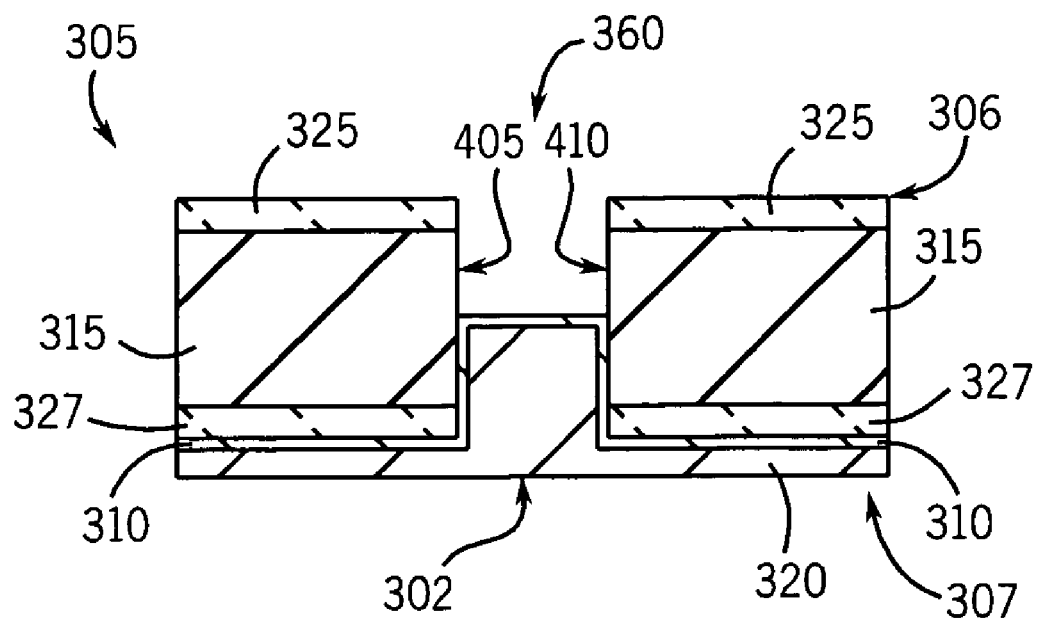
FIG. 4 is a representation of a double-sided etch process performed on the wafer portion of the apparatus of FIG. 3. The wafer portion is processed to the through-etch.
Figure 5:
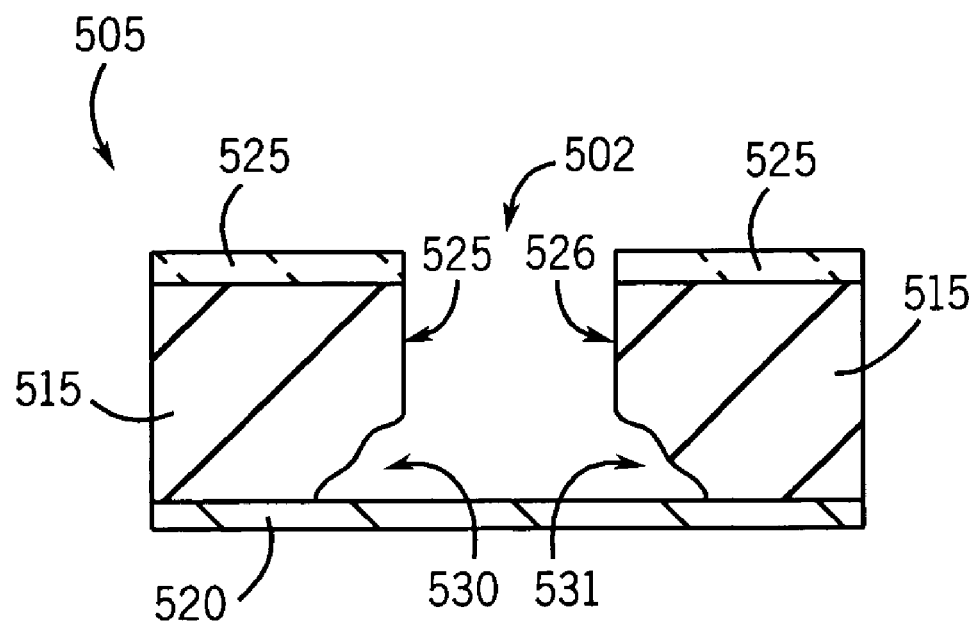
FIG. 5 is a representation of an exemplary implementation of a prior art wafer portion. The wafer portion comprises a silicon layer, a backing layer, and a mask layer.

Turning to FIGS. 3–4, a wafer portion 305 comprises a conduction layer 310, a silicon layer 315, a backing layer 320, a first oxide layer 325, and a second oxide layer 327. The wafer portion 305 undergoes a first portion of an etch process on a first side 306 of the wafer portion 305. The wafer portion 305 undergoes the first portion of the etch process up to a point just short of the midpoint of thickness, as will be understood by those skilled in the art. The wafer portion 305 undergoes the first portion of the etch process to etch the structure 360 in the silicon layer 315.

The wafer portion 305 undergoes a second portion of the etch process on a second side 307 of the wafer portion 305. The oxide layer 327 is patterned to define a structure 302 to be etched in the second side 307 of the wafer portion 305. The second portion of the etch process serves to etch the structure 302 in the silicon layer 115. The conduction layer 310 is applied to the second side 307 of the wafer portion 302. The conduction layer 310 is coupled with the silicon layer 315. The backing layer 320 is applied to the second side 307 of the wafer portion 305. The backing layer 320 is coupled with the conductive layer 310.

The wafer portion 305 undergoes a third portion of the etch process on the first side 306 of the wafer portion 305. The third portion of the etch process serves to through-etch the structure 360 in the silicon layer 315. During the third portion of the etch process, the conduction layer 310 is exposed. The third portion of the etch process etches the sidewalls 405 and 410 of the structure 360.

The conduction layer 310 promotes the reduction of the undercutting of the structure 360 etched in the wafer portion 305 and promotes the reduction in the amount of protruding features created on the structure 360. The conduction layer 310 dissipates the charge buildup on the structure 360. The conduction layer 310 electrically couples the sidewalls 405 and 410. The sidewall 405 and 410 and the conduction layer 310 are at substantially a similar potential resulting in the dissipation of the charge buildup on the structure 360.

Again referring to FIGS. 1–4, the apparatus described herein is one example that comprises a plurality of components such as hardware components. A number of such components can be combined or divided in the apparatus 100. The apparatus 100 in one example comprises any (e.g., horizontal, oblique, or vertical) orientation, with the description and figures herein illustrating one exemplary orientation of the apparatus 100, for explanatory purposes. The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
   a wafer portion that comprises a conduction layer;
   wherein upon exposure of the conduction layer during an etch of the wafer portion, the conduction layer serves to dissipate a portion of a charge buildup on the wafer portion, and wherein the conduction layer is electrically coupled with a silicon layer of the wafer portion; and
   wherein removal of a portion of the silicon layer from the wafer Portion during the etch serves to expose the conduction layer.

2. The apparatus of claim 1,
   wherein the etch serves to create one or more sidewalls in a portion of the silicon layer, and wherein the conduction layer is electrically coupled with the one or more sidewalls; and
   wherein the one or more sidewalls and the conduction layer serve to dissipate the portion of the charge buildup on the wafer portion.

3. The apparatus of claim 2, wherein the one or more sidewalls comprise one or more electrostatic potentials substantially similar to an electrostatic potential of the conduction layer;
   wherein the one or more electrostatic potentials of the one or more sidewalls serve to dissipate the portion of the charge buildup from the one or more sidewalls.

4. The apparatus of claim 1, wherein the wafer portion comprises a backing layer coupled with the conduction layer; and
   wherein the backing layer provides structural integrity to the wafer portion; and
   wherein the backing layer Insulates the conduction layer.

5. The apparatus of claim 4, wherein the backing layer comprises a photoresist.

6. The apparatus of claim 1, wherein the conduction layer serves to mitigate one or more etch rate variations across the wafer portion.

7. The apparatus of claim 1, wherein the conduction layer neutralizes the portion of the charge buildup on the wafer portion.

8. The apparatus of claim 1, wherein the conduction layer comprises a conductive material.

9. The apparatus of claim 8, wherein the conductive material comprises aluminum.

10. The apparatus of claim 1, wherein the conduction layer comprises a thickness In the range of about one half micrometer ("μ") to about two micrometers.

11. The apparatus of claim 1, wherein said etch is selected from the group consisting of a Deep Reactive Ion Etch (DRIE) and a Bosch process.

* * * * *